(12) United States Patent
Rieutort-Louis et al.

(10) Patent No.: US 11,049,445 B2
(45) Date of Patent: Jun. 29, 2021

(54) ELECTRONIC DEVICES WITH NARROW DISPLAY BORDERS

(71) Applicant: Apple Inc., Cupertino, CA (US)

(72) Inventors: Warren S. Rieutort-Louis, Cupertino, CA (US); Shyuan Yang, Burlingame, CA (US); Tsung-Ting Tsai, Cupertino, CA (US); Cheng-Ho Yu, Milpitas, CA (US); Jae Won Choi, San Jose, CA (US); Bhadrinarayana Lalgudi Visweswaran, Santa Clara, CA (US); Abbas Jamshidi Roudbari, San Jose, CA (US); Ting-Kuo Chang, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/975,390

(22) Filed: May 9, 2018

(65) Prior Publication Data

US 2019/0043418 A1 Feb. 7, 2019

Related U.S. Application Data

(60) Provisional application No. 62/540,480, filed on Aug. 2, 2017.

(51) Int. Cl.
*G09G 3/3216* (2016.01)
*H01L 27/32* (2006.01)
(Continued)

(52) U.S. Cl.
CPC ......... *G09G 3/3216* (2013.01); *G09G 3/3225* (2013.01); *G09G 3/3266* (2013.01);
(Continued)

(58) Field of Classification Search
CPC .. G09G 3/3216; G09G 3/3275; G09G 3/3225; G09G 3/3266; G09G 3/3283;
(Continued)

(56) References Cited

U.S. PATENT DOCUMENTS 7,375,716 B2 * 5/2008 Toriumi ............... G09G 3/3688
345/100
8,583,187 B2 * 11/2013 Kim ..................... G06F 1/1656
455/566

(Continued)

*Primary Examiner* — Jose R Soto Lopez
(74) *Attorney, Agent, or Firm* — Treyz Law Group, P.C.; Tianyi He

(57) ABSTRACT

A display may have rows and columns of pixels that form an active area for displaying images. A display driver integrated circuit may provide multiplexed data signals to demultiplexer circuitry in the display. The demultiplexer circuitry may demultiplex the data signals and provide the demultiplexed data signals to the pixels on data lines. Gate lines may control the loading of the data signals into the pixels. The display may have a length dimension and a width dimension that is shorter than the length dimension. The data lines may extend parallel to the width dimension and the gate lines may extend parallel to the length dimension such that there are more data lines than gate lines in the display. A notch that is free of pixels may extend into the active area. Data lines extending parallel to the width dimension of the display may be routed around the notch.

15 Claims, 11 Drawing Sheets

(51) Int. Cl.
*G09G 3/3266* (2016.01)
*G09G 3/3283* (2016.01)
*G09G 3/3275* (2016.01)
*G09G 3/3225* (2016.01)
*H01L 51/52* (2006.01)

(52) U.S. Cl.
CPC ......... *G09G 3/3275* (2013.01); *G09G 3/3283* (2013.01); *H01L 27/3234* (2013.01); *H01L 27/3276* (2013.01); *G09G 2300/0426* (2013.01); *G09G 2310/0297* (2013.01); *H01L 27/3218* (2013.01); *H01L 51/5253* (2013.01)

(58) Field of Classification Search
CPC .... G09G 2300/0426; G09G 2310/0297; H01L 27/3276; H01L 27/3234; H01L 51/5253; H01L 27/3218
See application file for complete search history.

(56) References Cited

U.S. PATENT DOCUMENTS

| | | | | |
|---|---|---|---|---|
| 9,210,810 B2* | 12/2015 | Hack | | H05K 1/028 |
| 9,804,711 B2* | 10/2017 | Noguchi | | G06F 3/0446 |
| 2002/0075248 A1* | 6/2002 | Morita | | G09G 3/3677 |
| | | | | 345/204 |
| 2003/0098833 A1* | 5/2003 | Sekido | | G09G 3/3688 |
| | | | | 345/87 |
| 2005/0007354 A1* | 1/2005 | Yamada | | H05K 1/189 |
| | | | | 345/204 |
| 2005/0078066 A1* | 4/2005 | Kim | | G09G 3/3266 |
| | | | | 345/80 |
| 2005/0265400 A1* | 12/2005 | Shin | | G09G 3/3275 |
| | | | | 370/540 |
| 2006/0232541 A1* | 10/2006 | Kudo | | G09G 3/3688 |
| | | | | 345/98 |
| 2007/0085963 A1* | 4/2007 | Huang | | G09G 3/3677 |
| | | | | 349/152 |
| 2008/0143660 A1* | 6/2008 | Itou | | G09G 3/3688 |
| | | | | 345/87 |
| 2009/0049773 A1* | 2/2009 | Zadesky | | B32B 17/10293 |
| | | | | 52/204.62 |
| 2009/0121328 A1* | 5/2009 | Hsu | | G02F 1/13452 |
| | | | | 257/668 |
| 2009/0201231 A1* | 8/2009 | Takahara | | G09G 3/3233 |
| | | | | 345/76 |
| 2009/0244035 A1* | 10/2009 | Cho | | G02F 1/13452 |
| | | | | 345/204 |
| 2009/0257189 A1* | 10/2009 | Wang | | H05K 5/061 |
| | | | | 361/679.56 |
| 2009/0262292 A1* | 10/2009 | Lee | | G02F 1/1345 |
| | | | | 349/149 |
| 2009/0267877 A1* | 10/2009 | Yen | | G09G 3/006 |
| | | | | 345/87 |
| 2010/0014014 A1* | 1/2010 | Kim | | G02F 1/136286 |
| | | | | 349/42 |
| 2010/0110058 A1* | 5/2010 | Moh | | G09G 3/3655 |
| | | | | 345/211 |
| 2010/0225625 A1* | 9/2010 | Morita | | G09G 3/3688 |
| | | | | 345/205 |
| 2010/0315570 A1* | 12/2010 | Mathew | | G06F 1/1601 |
| | | | | 349/58 |
| 2011/0075089 A1* | 3/2011 | Jheng | | G09G 3/20 |
| | | | | 349/152 |
| 2011/0080383 A1* | 4/2011 | Huang | | G02F 1/13454 |
| | | | | 345/204 |
| 2011/0122117 A1* | 5/2011 | Lee | | G11C 19/28 |
| | | | | 345/211 |
| 2012/0050975 A1* | 3/2012 | Garelli | | H01Q 1/42 |
| | | | | 361/679.27 |
| 2012/0069241 A1* | 3/2012 | Shiau | | G06F 1/1605 |
| | | | | 348/373 |
| 2012/0105400 A1* | 5/2012 | Mathew | | H04N 5/2257 |
| | | | | 345/207 |
| 2012/0106048 A1* | 5/2012 | Byeon | | G09F 13/0413 |
| | | | | 361/679.01 |
| 2012/0162161 A1* | 6/2012 | Ino | | G09G 3/3688 |
| | | | | 345/204 |
| 2012/0169578 A1* | 7/2012 | Kim | | G09G 3/3688 |
| | | | | 345/93 |
| 2012/0306826 A1* | 12/2012 | Tsuchi | | G09G 3/3688 |
| | | | | 345/204 |
| 2012/0314354 A1* | 12/2012 | Rayner | | H04M 1/18 |
| | | | | 361/679.01 |
| 2013/0088466 A1* | 4/2013 | Odake | | G02B 30/27 |
| | | | | 345/204 |
| 2016/0042692 A1* | 2/2016 | Ota | | G09G 3/3233 |
| | | | | 345/215 |
| 2016/0266672 A1* | 9/2016 | Inagaki | | G04G 21/02 |
| 2016/0343777 A1* | 11/2016 | Hirakata | | H01L 51/0097 |
| 2017/0154945 A1* | 6/2017 | Shin | | H01L 27/3276 |
| 2017/0168648 A1* | 6/2017 | Takahashi | | G06F 3/0445 |
| 2017/0302772 A1* | 10/2017 | Zhang | | H05K 1/028 |
| 2018/0061307 A1* | 3/2018 | Inoue | | G09G 3/3275 |
| 2018/0166004 A1* | 6/2018 | Li | | G09G 3/20 |
| 2018/0226041 A1* | 8/2018 | Kawashima | | G09G 3/3677 |
| 2018/0247582 A1* | 8/2018 | Park | | G06F 1/1637 |
| 2018/0249584 A1* | 8/2018 | Kim | | H04M 1/0268 |
| 2018/0336813 A1* | 11/2018 | Li | | G09G 3/2092 |
| 2019/0005915 A1* | 1/2019 | Liu | | G02F 1/13454 |

* cited by examiner

ELECTRONIC DEVICES WITH NARROW DISPLAY BORDERS

This application claims the benefit of provisional patent application No. 62/540,480, filed Aug. 2, 2017, which is hereby incorporated by reference herein in its entirety.

BACKGROUND

This relates generally to electronic devices, and more particularly, to electronic devices with displays.

Electronic devices often include displays. For example, cellular telephones and portable computers often include displays for presenting information to a user.

Displays contain arrays of pixels for presenting images to a user. The array of pixels may be bordered by an inactive area that does not include pixels. Data lines provide data signals from a display driver integrated circuit mounted in the inactive area to the pixels in the array. Data lines originating from the display driver integrated circuit fan out in the inactive area along the edge of the pixel array before extending into the active area. The inactive area must be large enough to accommodate the data line fanout. Accommodating the data line fanout may result in the display having a border along the edge on which display driver integrated circuit is mounted.

For aesthetic reasons and to save space in an electronic device, it may be desirable to reduce the size of the borders of a display. The border needed to accommodate the data line fanout limits the minimum achievable border size for a display and restricts display layout. If care is not taken, a display will have larger inactive borders than desired. Challenges may also arise in routing data lines in displays in which the size of inactive borders has been reduced.

SUMMARY

A display may have an array of pixels surrounded by an inactive border. Data lines may provide data signals from a display driver integrated circuit mounted in the inactive border to the pixels in the array. Gate lines may provide gate signals to the pixels that control the programming of the data signals into the pixels. The data signals may be routed through demultiplexer circuitry that is interposed between the array of pixels and the display driver integrated circuit to reduce the number of lines extending from the display driver integrated circuit in the inactive border.

The display may be rectangular with two opposing long edges and two opposing short edges. The display driver integrated circuit and the demultiplexer circuitry may be mounted along one of the long edges. The data lines may extend from the demultiplexer circuitry parallel to the shorter dimension of the display. The gate lines may extend parallel to the longer dimension of the display.

The display may include an inactive notch region along one of the short edges that extends into the active area of the display to accommodate a speaker or other components. Data lines extending parallel to this short edge may be routed around the notch region.

DETAILED DESCRIPTION

Figure 1:
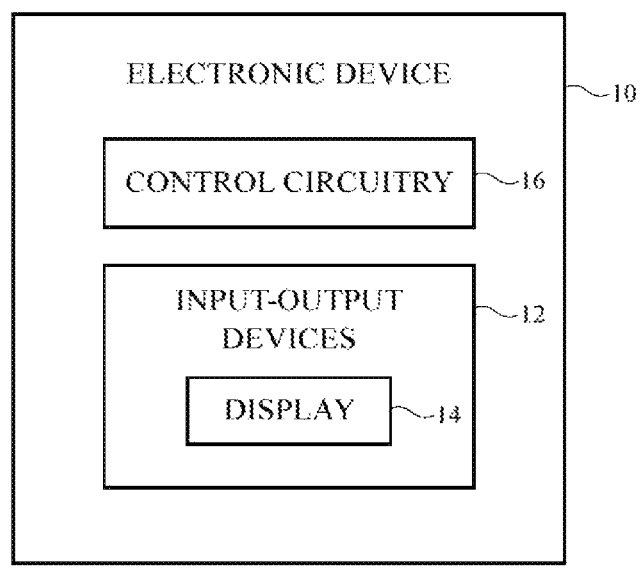
FIG. 1 is a diagram of an illustrative electronic device having a display in accordance with an embodiment.

An illustrative electronic device of the type that may be provided with an organic light emitting diode display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a display, a computer display that contains an embedded computer, a computer display that does not contain an embedded computer, a gaming device, a navigation device, an embedded system such as a system in which electronic equipment with a display is mounted in a kiosk or automobile, or other electronic equipment.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. A touch sensor for display 14 may be formed from electrodes formed on a common display substrate with the pixels of display 14 or may be formed from a separate touch sensor panel that overlaps the pixels of display 14. If desired, display 14 may be insensitive to touch (i.e., the touch sensor may be omitted).

Control circuitry 16 may be used to run software on device 10 such as operating system code and applications. During operation of device 10, the software running on control circuitry 16 may display images on display 14.

Figure 2:
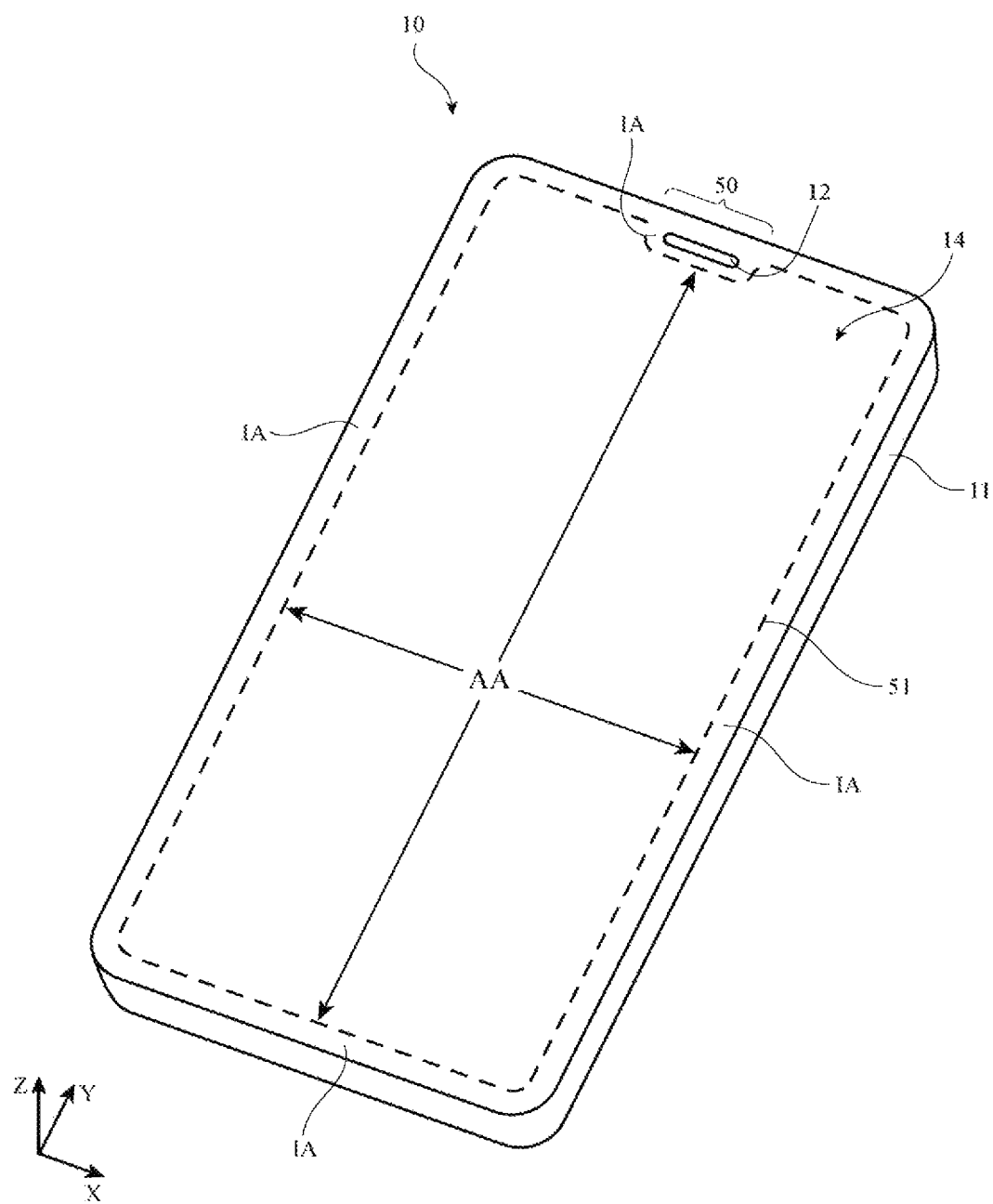
FIG. 2 is a perspective view of an illustrative electronic device having a display with an active area and an inactive area in accordance with an embodiment.

A perspective view of an illustrative electronic device 10 is shown in FIG. 2. Device 10 may have a housing 11 in which components such as input-output devices 12, display 14, and control circuitry 16 are mounted. Housing 11, which may sometimes be referred to as an enclosure or case, may be formed of plastic, glass, ceramics, fiber composites, metal (e.g., stainless steel, aluminum, titanium, gold, etc.), other suitable materials, or a combination of any two or more of these materials. Housing 11 may be formed using a unibody configuration in which some or all of housing 11 is machined or molded as a single structure or may be formed using multiple structures (e.g., an internal frame structure, one or more structures that form exterior housing surfaces, etc.).

As shown in FIG. 2, display 14 may have an active area AA and an inactive area IA that together take up most or all of the front face of device 10. Active area AA may include pixels that emit light to display images from a user. Inactive border area IA may surround active area AA and be used to accommodate display driver circuitry, gate driver circuitry, power supply circuitry, and conductive paths for providing display signals to the pixels in the active area. Inactive area IA may be free of display pixels. Active area AA and inactive area IA may meet at a border 51 (sometimes referred to herein as the active area border, inactive area border, boundary, or dividing line between the active area and the inactive area) In order to accommodate input-output components 12 such as a speaker, camera, ambient light sensor, or proximity sensor in device 10, a portion of inactive area IA may extend into active area AA to form a notch 50 (sometimes referred to herein as a notched region or inactive notch). The shape of border 51 between the active area and the inactive area may have bent portions (sometimes referred to herein as curved portions, deflected portions, meandering portions, or serpentine portions) where notch 50 extends into the active area. Since inactive area IA is free of display pixels, input-output components may be mounted in the notched area without being obstructed by the active display structures.

Display 14 may be an organic light-emitting diode display. In an organic light-emitting diode display, each pixel contains a respective organic light-emitting diode. A positive power supply voltage ELVDD may be supplied to a positive power supply terminal of the organic light-emitting diode and a ground power supply voltage ELVSS may be supplied to ground power supply terminal of the organic light emitting diode. The diode has an anode (terminal AN) and a cathode (terminal CD). The state of a drive transistor controls the amount of current flowing through the diode and therefore the amount of emitted light from the display pixel. The cathode is coupled to the ground terminal, so cathode terminal of the diode may sometimes be referred to as the ground terminal.

Figure 3:
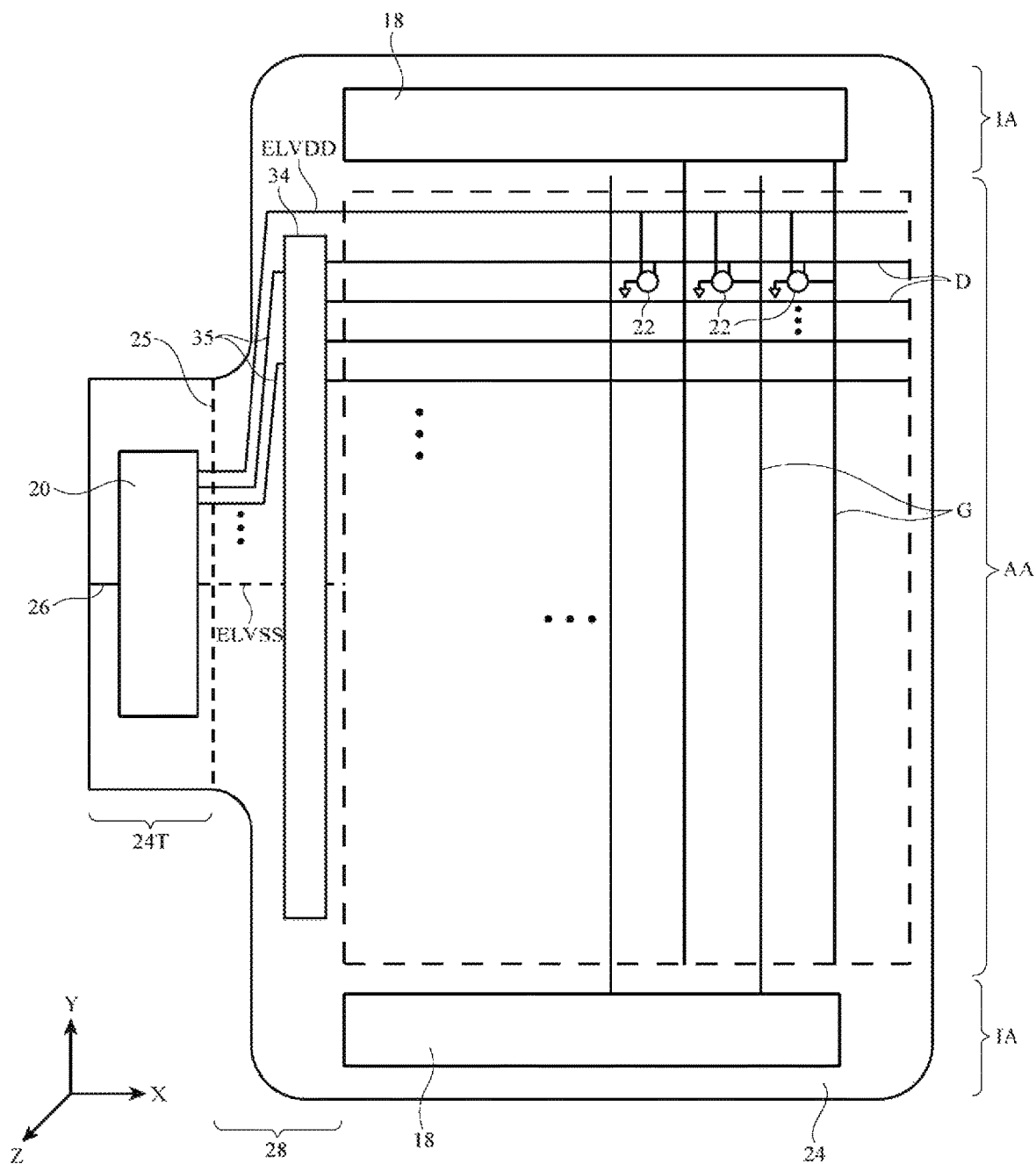
FIG. 3 is a diagram of an illustrative organic light-emitting diode display in accordance with an embodiment.

As shown in FIG. 3, display 14 may include layers such as substrate layer 24. Substrate 24 and, if desired, other layers in display 14, may be formed from layers of material such as glass layers, polymer layers (e.g., flexible sheets of polyimide or other flexible polymers), etc. Substrate 24 may be planar and/or may have one or more curved portions. Substrate 24 may have a rectangular shape with left and right vertical edges that extend along the Y-axis and upper and lower horizontal edges that extend along the X-axis, or may have a non-rectangular shape. In configurations in which substrate 24 has a rectangular shape with four corners, the corners may, if desired, be rounded. Display substrate 24 may, if desired, have a tail portion such as tail 24T. Display 14 may have an array of pixels 22. Pixels 22 form an active area AA of display 14 that displays images for a user. Inactive border portions of display 14 such as inactive areas IA along one or more of the edges of substrate 24 do not contain pixels 22 and do not display images for the user (i.e., inactive area IA is free of pixels 22).

Each pixel 22 may have a light-emitting diode such as organic light-emitting diode and associated thin-film transistor circuitry. The array of pixels 22 may be formed from rows and columns of pixel structures (e.g., pixels formed from structures on display layers such as substrate 24). There may be any suitable number of rows and columns in the array of pixels 22 (e.g., ten or more, one hundred or more, or one thousand or more). Display 14 may include pixels 22 of different colors. As an example, display 14 may include red pixels that emit red light, green pixels that emit green light, and blue pixels that emit blue light. Configurations for display 14 that include pixels of other colors may be used, if desired. The use of a pixel arrangement with red, green, and blue pixels is merely illustrative.

As shown in the example of FIG. 3, display substrate 24 may have a tail portion such as tail 24T that has a narrower width than the portion of substrate 24 that contains active area AA. This arrangement helps accommodate tail 24T within the housing of device 10. Tail 24T may, if desired, be bent under the rest of display 14 along bend axis 25 when display 14 is mounted within an electronic device housing.

Display driver circuitry 20 for display 14 may be mounted on a printed circuit board that is coupled to tail portion 24T or may be mounted on tail portion 24T. Signal paths such as signal path 26 may couple display driver circuitry 20 to control circuitry 16. Circuitry 20 may include one or more display driver integrated circuits and/or thin-film transistor circuitry.

During operation, the control circuitry of device 10 (e.g., control circuitry 16 of FIG. 1) may supply circuitry such as display driver circuitry 20 with information on images to be displayed on display 14. To display the images on display pixels 22, display driver circuitry 20 may supply corresponding image data to data lines D while issuing clock signals and other control signals to supporting display driver circuitry such as gate driver circuitry 18. Gate driver circuitry 18 may produce gate line signals (sometimes referred to as scan signals, emission enable signals, etc.) or other control signals for pixels 22. The gate line signals may be conveyed to pixels 22 using lines such as gate lines G. As shown in FIG. 3, there may be one or more gate lines per column of pixels 22. Gate driver circuitry 18 may include integrated circuits and/or thin-film transistor circuitry and may be located along the edges of display 14 (e.g., along the top and/or bottom edges of display 14 as shown in FIG. 3) or elsewhere in display 14 (e.g., as part of circuitry 20, on tail 24T, etc.). The configuration of FIG. 3 is merely illustrative.

Display driver circuitry 20 may supply data signals onto a plurality of corresponding data lines D. In the illustrative arrangement of FIG. 2, data lines D extend through display 14 along the X-axis. Data lines D are associated with respective rows of pixels 22.

With the illustrative configuration of FIG. 2, gate lines G run through display 14 along the Y-axis. Each gate line G is associated with a respective column of display pixels 22. If desired, there may be multiple vertical control lines such as gate lines G associated with each row of pixels 22. Gate driver circuitry 18 may assert gate line signals on the gate lines Gin display 14. For example, gate driver circuitry 18 may receive clock signals and other control signals from display driver circuitry 20 and may, in response to the received signals, assert a gate signal on gate lines G in sequence, starting with the gate line signal G in the first column of display pixels 22 (i.e., the right-most or left-most column of pixels). As each gate line is asserted, data from data lines D is programmed into the corresponding column of display pixels. In this way, control circuitry in device 10 such as display driver circuitry 20 may provide pixels 22 with signals that direct pixels 22 to generate light for displaying a desired image on display 14.

The circuitry of pixels 22 and, if desired, display driver circuitry such as circuitry 18 and/or 20 may be formed using thin-film transistor circuitry. Thin-film transistors in display 14 may, in general, be formed using any suitable type of thin-film transistor technology (e.g., silicon transistors such as polysilicon thin film transistors, semiconducting-oxide transistors such as indium gallium zinc oxide transistors, etc.).

Conductive paths (e.g., one or more signal lines, blanket conductive films, and other patterned conductive structures) may be provided in display 14 to route data signals D and power signals such as positive power supply signal ELVDD and ground power supply signal ELVSS to pixels 22. As shown in FIG. 3, these signals may be provided to pixels 22 in active area AA using signal routing paths that receive signals D, ELVDD, and ELVSS from tail portion 24T of display 14.

As shown in the illustrative example of FIG. 3, conductive paths originating from display driver circuit 20 extend along the X-axis on tail 24T, and then extend along the Y-axis on the main portion of substrate 24 to reach a corresponding row of pixels 22 to which data signals are to be provided. The portion of display 14 on which these conductive paths extend along the Y-axis to reach a row of pixels 22 may be referred to as fanout region 28. The width of fanout region 28 along the X-axis is generally proportional to the number of conductive lines that are routed through the fanout region 28. Routing each data line in the display through the fanout region 28 can produce a relatively large inactive border area. Reducing the width of the fanout region 28 may allow the width of the border of display 14 to be minimized or eliminated.

Figure 4:
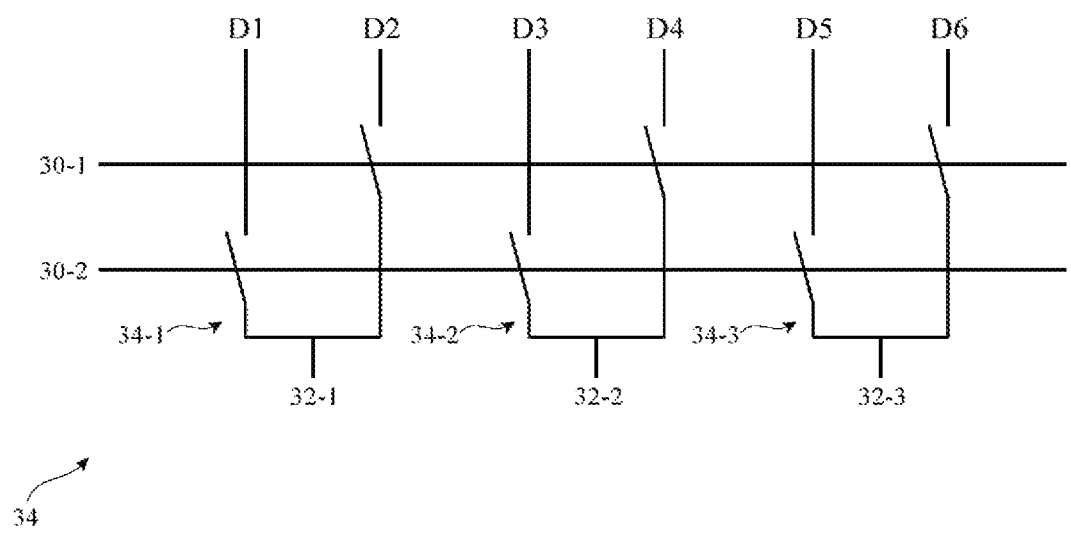
FIG. 4 is a diagram of illustrative demultiplexer circuitry in accordance with an embodiment.

An illustrative example of time-division demultiplexer circuitry 34 that may be incorporated in display 14 is shown in FIG. 4. Data line extensions 35 (sometimes referred to herein as multiplexed data lines, peripheral data lines, or demultiplexer input lines) may provide time-division multiplexed data signals form display driver 20 to demultiplexer circuitry 34. Demultiplexer circuitry 34 may include multiple time division demultiplexers 34-1, 34-2, and 34-3. Each demultiplexer may have a single respective data line extension 32-1, 32-2, or 32-3 on which time-division multiplexed data signals for two or more data lines D are provided. The output lines of each demultiplexer may be two or more data lines D (e.g., data lines D1 and D2, data lines D3 and D4, data lines D5 and D6, etc.). Control lines 30-1 and 30-2 may control which of the data line outputs of each respective demultiplexer receives the data signal on the demultiplexer's data line extension. If desired, control signals for control lines 30-1 and 30-2 can be provided by display driver 20. When display driver circuit 20 is providing data signals for a first set of the data lines in the display (e.g., odd-number data lines D1, D3, D5, etc.) at a first time, control line 30-2 may be asserted and control line 30-1 may be de-asserted to provide the data signals to the first set of corresponding data lines. When display driver circuit 20 is subsequently providing data signals for a second set of the data lines in the display at a second time (e.g., even-number data lines D2, D4, D6, etc.), control line 30-1 may be asserted and control line 30-2 may be de-asserted to provide the data signals to the second set of corresponding data lines. The three demultiplexers 34-1, 34-2, and 34-3 provided for six data lines D are merely illustrative. If desired, every data line D in display 14 may be coupled to a demultiplexer and may be provided data signals using a time-division demultiplexing scheme as described above.

By incorporating demultiplexer circuitry 34 next to active area AA and routing input lines 35 through fanout region 28, the number of lines that must be routed through fanout region 28 may be reduced. Reducing the number of lines that must be routed through fanout region 28 may reduce the size of fanout region 28 and the size of the inactive border of display 14. In the example of FIGS. 3 and 4, the number of lines routed through fanout region 28 would be reduced by half by using 1:2 demultiplexers, but this is merely illustrative. If desired, each demultiplexer in circuitry 34 may be coupled to and demultiplex signals for three, four, five, or more data lines D, thereby allowing for the size of fanout region 28 to be reduced even further.

When displaying a frame of image data on display 14, each pixel 22 in display 14 must be provided with its respective data signal for the frame before the gate signals on gate lines G can be asserted to program the pixels and display the frame. The amount of time required to load the data signals into the pixels may be referred to as data signal loading time. The amount of time required to assert the gate signal for a given row of the display and program the pixels may be referred to as pixel programming time. The total amount of time required to load the data signals and program the pixels may be referred to as row time.

Because the display must program a new frame of image data at a given frequency to ensure proper operation of the display, the row time duration is limited by the frame rate and the number of gate lines in the display on which gate signals must be asserted. For example, a display operating at a frame rate of 60 Hz will display 60 frames of image data every second, and therefore must load all of the data signals and program all of the pixels in the display for a given frame in approximately 16 milliseconds. In a display that has, for example, 2,500 gate lines and 1,250 data lines (e.g., a display having a length dimension about twice its width dimension, and in which the gate lines extend parallel to the shorter width dimension) the display will have approximately 6.4 microseconds to perform data signal loading and pixel programming for each row of the display. The row time for such an illustrative display would therefore be 6.4 microseconds. For displays having different numbers of rows and/or different frame rates, the row time may be calculated as the inverse of the frame rate divided by the number of columns of gate lines in the display.

In a display in which each data line is routed directly to its corresponding column of pixels, all data signals are loaded into the pixels at once. Data loading can be performed while still allowing enough time for pixel programming. However, the data line fanout in such an arrangement may cause the display to have an undesirably large inactive border.

In a display that includes time-division demultiplexer circuitry 34 of the type shown in FIGS. 3 and 4, data loading takes place once for a first subset of the pixels in the array when control line 30-1 is asserted, and again for a second subset of the pixels in the array when control line 30-2 is asserted. This increases the amount of time required for data loading. If care is not taken, the amount of time available for pixel programming may be reduced and undesirable display artifacts, poor display uniformity, and increased panel mura may result. In order to avoid these effects, it is desirable to increase the available pixel programming time.

Since the amount of time needed for each data loading cycle is relatively fixed and it is generally not desirable to operate the display at a reduced frame rate for extended periods of time, one method of increasing the available programming time is to effectively increase the row time of the display by reducing the number of gate signals that must applied to program the pixels 22.

In the illustrative example of FIG. 3, display driver integrated circuit 20 is mounted along one of the longer edges of the display. Data lines D (corresponding to the pixel rows) coupled to display driver 20 extend parallel to the X-axis (along the width of the display 14). Gate lines G (corresponding to the pixel columns) extend parallel to the Y-axis (along the length of the display 14). Because the data lines extend along the shorter width edge of the display 14 and the gate lines extend along the longer length edge of the display 14, the number of gate lines in the display of FIG. 3 is minimized. For a display having approximately 2,500 rows of pixels and approximately 1,250 columns of pixels (e.g., a display having a length dimension approximately twice its width dimension), the arrangement of FIG. 3 would include approximately 2,500 data lines that extend between the longer edges of the display along the X-axis, and approximately 1,250 gate lines that extend between the shorter edges of the display along the Y-axis. The row time for a display of the type shown in FIG. 3 operating at 60 Hz may be approximately 12.8 microseconds. This increased row time may allow for the incorporation of demultiplexer circuitry 34 and the use of two separate data loading periods, while still allowing enough pixel programming time to program all of the pixels in display 14.

Configurations described above in which the aspect ratio of display 14 is 1:2 is merely illustrative. If desired, the length of display 14 along the Y-axis may be at least 1.5 times greater than the width of display 14 along the X-axis (e.g., there may be 1.5 times as many pixel rows as pixel columns, and 1.5 times as many data lines as gate lines). In another suitable arrangement, the length of display 14 along the Y-axis may be at least 3 times greater than the width of display 14 along the X-axis (e.g., there may be 3 times as many pixel rows as pixel columns, and 3 times as many data lines as gate lines). The number of gate lines and data lines described above are also merely illustrative. In general, a display 14 of the type shown in FIG. 3 may have any suitable number of gate and data lines.

In an arrangement of the type shown in FIG. 3, the row time of the display may be increased such that there may actually be more time than is needed to perform data loading and pixel programming. In this situation, the frame rate of the display may be increased to a higher frequency while still providing enough row time for data loading and pixel programming. For example, the frame rate of a display 14 as shown in FIG. 3 may be increased to 90 Hz. Based on an illustrative example in which the display includes 1,250 gate lines, such an arrangement would provide a row time of approximately 8.9 microseconds, which may still be sufficient to perform data loading and pixel programming operations without introducing undesirable display effects.

An arrangement of the type shown in FIG. 3 in which gate lines G extend along the long edge of the display may require increased loading on the gate lines G. In order to ensure that gate driver circuitry 18 can sufficiently drive the longer gate lines G, it may be desirable to increase the driving capabilities of the gate drivers in gate driver circuitry 18. For example, gate drivers in gate driver circuitry 18 (which may be arranged along one or both of the shorter edges of display 14 that extend along the X-axis) may be provided with enhanced output buffering capabilities in the arrangement of FIG. 3.

As shown in FIG. 3, a positive power supply ELVDD signal line and ground power supply ELVSS signal line may extend from tail portion 24T to the active and inactive areas of display 14. Because the positive power supply signal ELVDD originates from the center of the display, the number of pixels that each power supply line must power may be reduced in an arrangement of the type shown in FIG. 3. This may result in reduced IR drop on the ELVDD power lines and provide improved display uniformity. Some IR drop improvements may also be seen on ELVSS power lines. Since the ELVSS power signal originates from the edge of the display, however, improvements in IR drop for the ELVSS power supply line may be less pronounced than the improvements observed for the ELVDD power supply line.

In order to prevent moisture and air from contacting and potentially degrading the organic light-emitting material in an organic light-emitting diode display such as display 14, encapsulation layers may be formed over the organic light-emitting diodes. These encapsulation layers may extend beyond the active area AA of the display 14 and into inactive areas IA in which structures such as demultiplexer circuitry 34 and conductive lines in fanout region 28 are formed.

Figure 5:
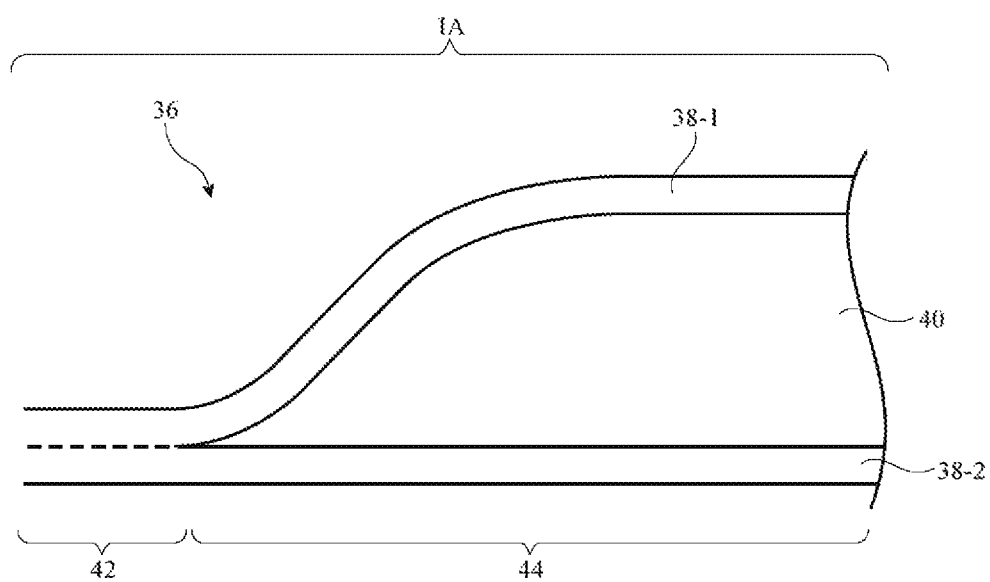
FIG. 5 is a cross-sectional side view of illustrative encapsulation structures in a display in accordance with an embodiment.

A cross-sectional side view of an illustrative encapsulation layer 36 in an inactive area of display 14 (e.g., an inactive area that includes fanout region 28) is shown in FIG. 5. Encapsulation layer 36 includes a monomer layer 40 between first and second inorganic layers (e.g., silicon nitride, silicon oxynitride, silicon oxide, etc.) 38-1 and 38-2. Monomer layer 40 may be deposited using ink jet printing methods. Inorganic layers 38-1 and 38-2 may be deposited using chemical vapor deposition (CVD) methods. The area in which monomer 40 is deposited may be referred to as ink-jet printing region 44. Due to the manufacturing processes used in forming encapsulation layer 36, inorganic layers 38-1 and 38-2 may extend beyond ink-jet printing region 44. The area in which inorganic layers 38-1 and 38-2 extend beyond ink-jet printing region 44 may be referred to as a CVD region. In a flexible organic light-emitting diode display in which display 14 is bent back behind itself, the desired bend radius of the bent portion of the display about bend axis 25 may determine the width of CVD region 42. In general, CVD region 42 should extend far enough beyond ink-jet printing region 44 to prevent possible separation of the layers in encapsulation layer 36 and avoid excess stress in the bend region of display 14. Additional evaporated layers deposited using evaporation techniques may be formed over encapsulation layer 36.

In a display of the type shown in FIG. 3 having reduced data line fanout width, the width of encapsulation layers in the inactive area of the display may also be reduced. Illustrative diagrams of the relative widths of encapsulation layer 36 and circuitry such as demultiplexer circuitry 34 are shown in FIGS. 6A-6C.

Figure 6A:
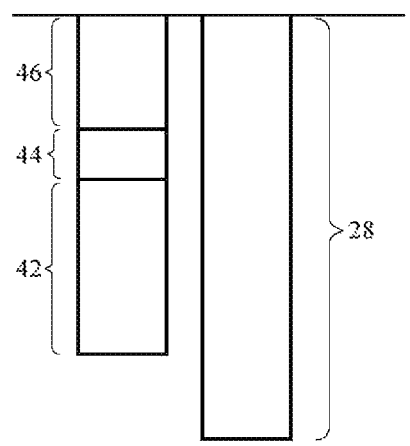
FIGS. 6A-6C are diagrams of layers of material in the encapsulation structures of FIG. 5 in accordance with an environment.

FIG. 6A is an illustrative diagram of display 14 having a typical fanout region 28 (e.g., a display that does not incorporate demultiplexer circuitry 34). In the illustrative example of FIG. 6A, fanout region 28 may have a width of about 1.5 millimeters. Evaporated layers 46 may have a width of about 400 micrometers. Ink-jet printing region 44 may have a width of about 165 micrometers. CVD region 42 may have a width of about 655 micrometers. In the example of FIG. 6A, the width of fanout region 28 is greater than the total width of the encapsulation and evaporated layers required to ensure proper display bending, so it may not be possible to reduce the width of the display border in this area.

Figure 6B:
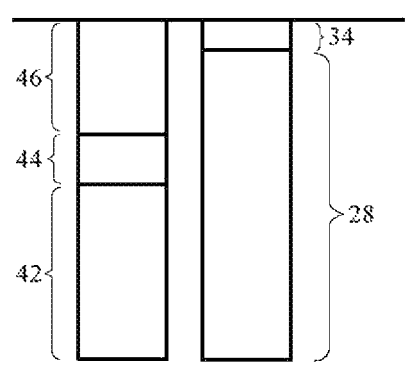

FIG. 6B is an illustrative diagram of display 14 having a reduced fanout region 28 (e.g., a display of the type shown in FIG. 3 that does incorporate demultiplexer circuitry 34). In the illustrative example of FIG. 6B, fanout region 28 may have a reduced width of about 1,125 micrometers. Demultiplexer circuitry 34 may have a width of about 100 micrometers. Evaporated layers 46 may have a width of about 400 micrometers. Ink-jet printing region 44 may have a width of about 165 micrometers. CVD region 42 may have a width of about 655 micrometers. In the example of FIG. 6B, the width of fanout region 28 is approximately equal to the total width of the encapsulation and evaporated layers required to ensure proper display bending. Thus, the width of the fanout region 28 no longer determines the requisite size of the display border in this region. This may allow for a narrower border than is possible in the example of FIG. 6A.

Figure 6C:
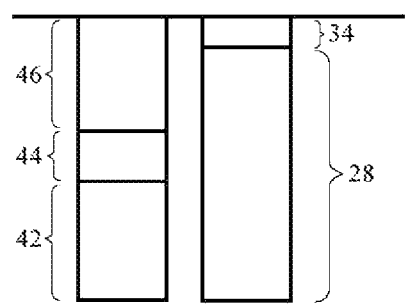

FIG. 6C is an illustrative diagram of display 14 having a reduced fanout region 28 (e.g., a display of the type shown in FIG. 3 that does incorporate demultiplexer circuitry 34). In the illustrative example of FIG. 6C, fanout region 28 may have a reduced width of about 1,000 micrometers. Demultiplexer circuitry 34 may have a width of about 100 micrometers. Evaporated layers 46 may have a width of about 400 micrometers. Ink-jet printing region 44 may have a width of about 165 micrometers. CVD region 42 may have a reduced width of about 425 micrometers. By reducing the width of CVD region 42 and fanout region 28, the width of the display border may be reduced in an arrangement of the type shown in FIG. 6C.

The exemplary widths of the fanout region 28, demultiplexer circuitry 34, evaporated layers 46, ink-jet printing region 44, and CVD region 42 described above are merely illustrative. The respective widths of each of these layers may be adjusted as needed in a given display 14.

Bending display 14 back on itself may introduce stress into the display substrate 24 and other display layers such as encapsulation layer 36. In order to minimize this stress, substrate 24 may be provided with one or more openings in or adjacent to the bent portion of substrate 24 (e.g., along bend axis 25). An opening in display substrate 24 may include one or more holes, slits, mesh patterns, or other arrangements that help to reduce stress in the display when substrate 24 is bent.

Figure 7:
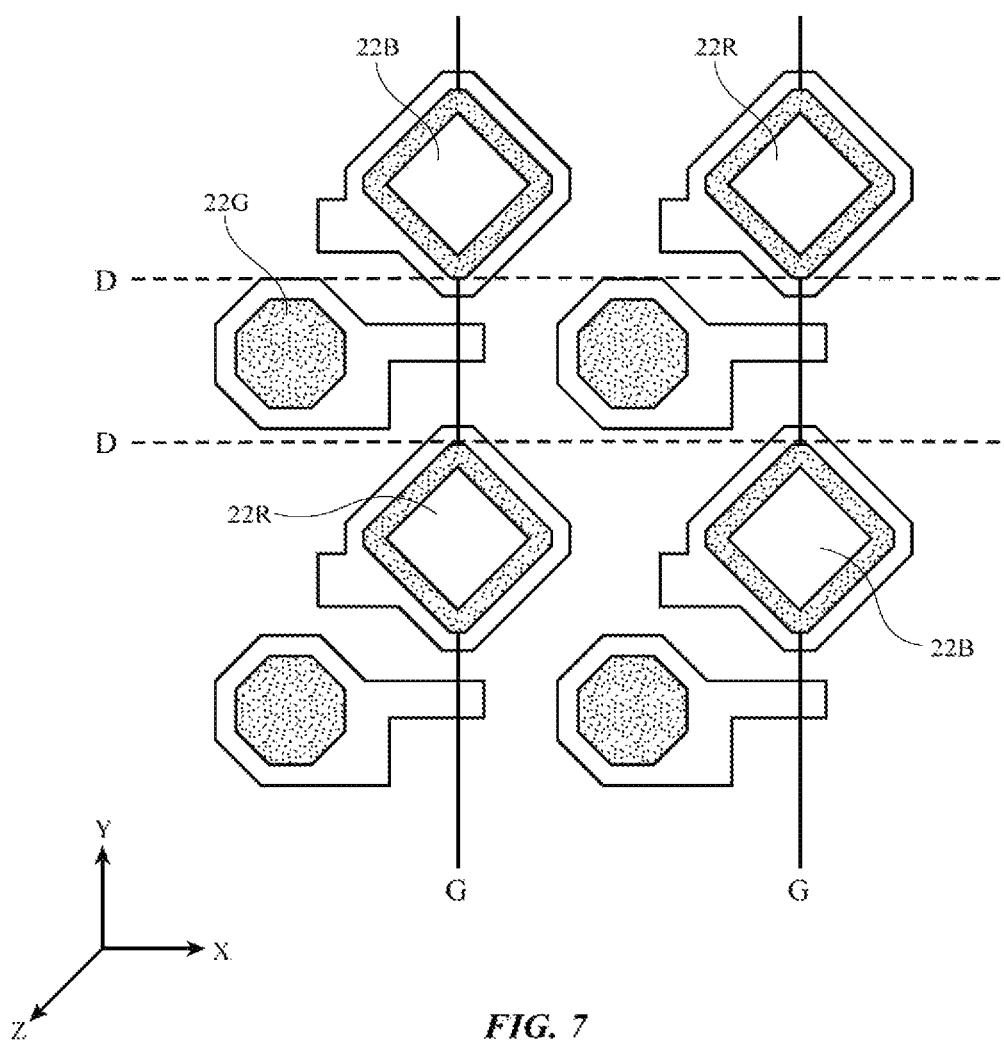
FIG. 7 is a diagram of an illustrative pixel arrangement in accordance with an embodiment.

An illustrative example of a typical pixel arrangement for a display in which display driver integrated circuit 20 is mounted along a long edge of the display (e.g., a display that incorporates demultiplexer circuitry 34 and/or a reduced-width fanout region 28) is shown in FIG. 7. As shown in FIG. 7, the red pixels 22R, green pixels 22G, and blue pixels 22B are arranged in a diamond pattern in which columns of alternating red pixels 22R and blue pixels 22B are formed between columns of green pixels 22G. The gate lines G extend across the display along the Y-axis, and the data lines D extend across the display along the X-axis.

Figure 8:
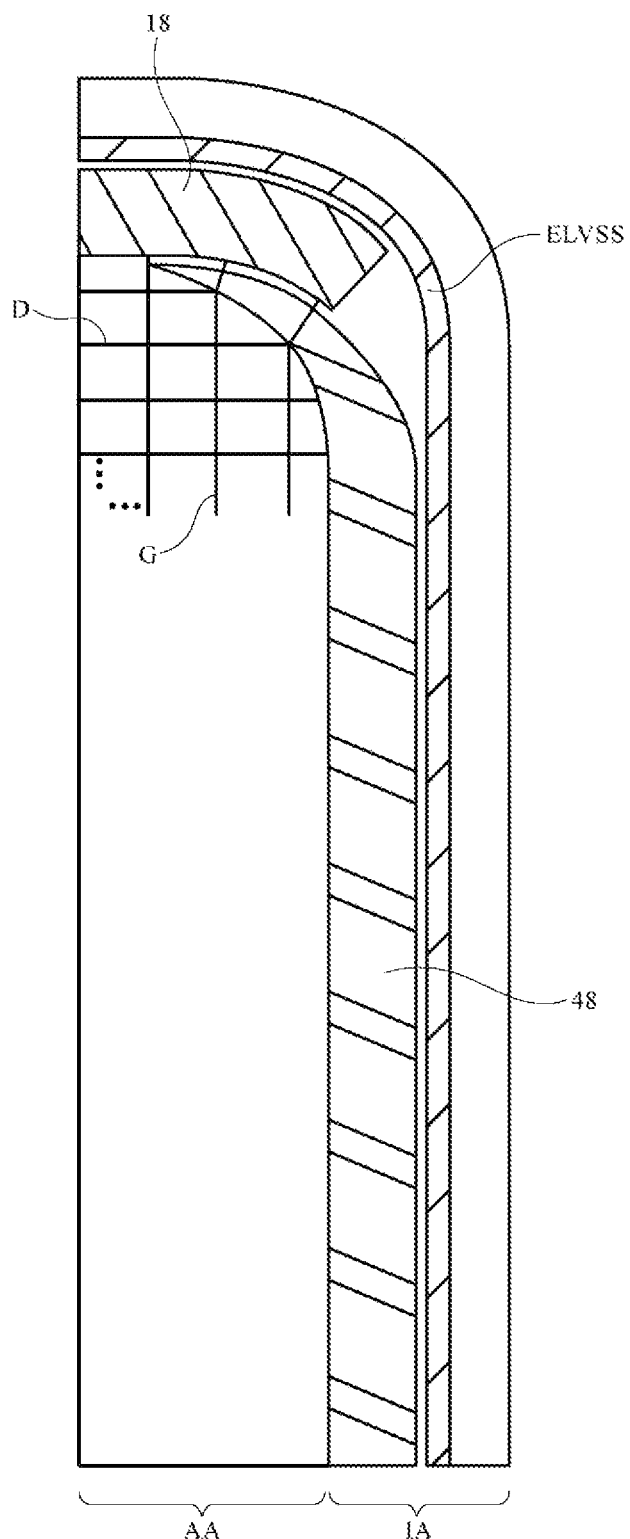
FIG. 8 is a diagram of a corner portion of a display that includes data line loading circuitry in accordance with an embodiment.

If desired, display 14 may have rounded corners. An illustrative example of a portion of such a display (e.g., the top right corner of the display shown in FIG. 3) is shown in FIG. 8. Due to the rounded shape of the corners of display 14, data lines D may that terminate in the corner region may have different relative lengths. For example, the data lines near the top of the rounded corner portion may be shorter and may be coupled to fewer pixels 22 than data lines in the rounded corner portion that are closer to the center of the display. The differences in the lengths of the data lines in the corner region and the differences in the number of pixels 22 coupled to these data lines may cause the electrical loads on these data lines to be uneven. For example, applying the same voltage to two data lines in the corner region may nonetheless result in different loading on the respective data lines due to their different lengths. This effect may be exacerbated when demultiplexing circuitry 34 is incorporated into display 14, as one set of data lines (e.g., data lines that receive data signals when control signal 30-1 is asserted) will be floating when they are not receiving data signals (e.g., when control signal 30-2 is asserted to provide data signals to the other set of data lines). When the control signal (e.g., control signals 30-1) for these data lines is re-asserted and the data lines are coupled back to their respective demultiplexers, abnormal charge sharing between the data lines can result and cause display artifacts.

To help minimize uneven data line loading and abnormal charge sharing, data line loading circuitry 48 may be incorporated in display 14. In the illustrative example of FIG. 8, data line loading circuitry 48 is incorporated along the edge of the display at which data lines D terminate. This, however is merely illustrative. Data line loading circuitry 48 may be incorporated elsewhere in display 14 (e.g., in display driver 20), if desired. Data line loading circuitry 48 may apply voltages to data lines D to help ensure that the data lines are loaded with the appropriate voltages. Data line loading circuitry 48 may include capacitors, resistors, or other electrical components that simulate the electrical effects of additional pixels coupled to the data lines. This may help to compensate for differences in data line length or the actual number of pixels coupled to the data lines. In this way, data line loading circuitry 48 may be referred to as data line compensation circuitry.

If desired, a notch-shaped inactive region 50 that is free of organic light-emitting diodes and does not display images may extend into active area AA. The notch-shaped inactive region may be an extension of the inactive area IA. In one arrangement, the notch may be formed along the short, upper edge of a rectangular display 14 of the type shown in FIG. 3. Because the notch is free of organic light-emitting diodes, it may be used to accommodate input-output components such as a speaker, an ambient light sensor, a proximity sensor, a camera, or other components.

Figure 9:
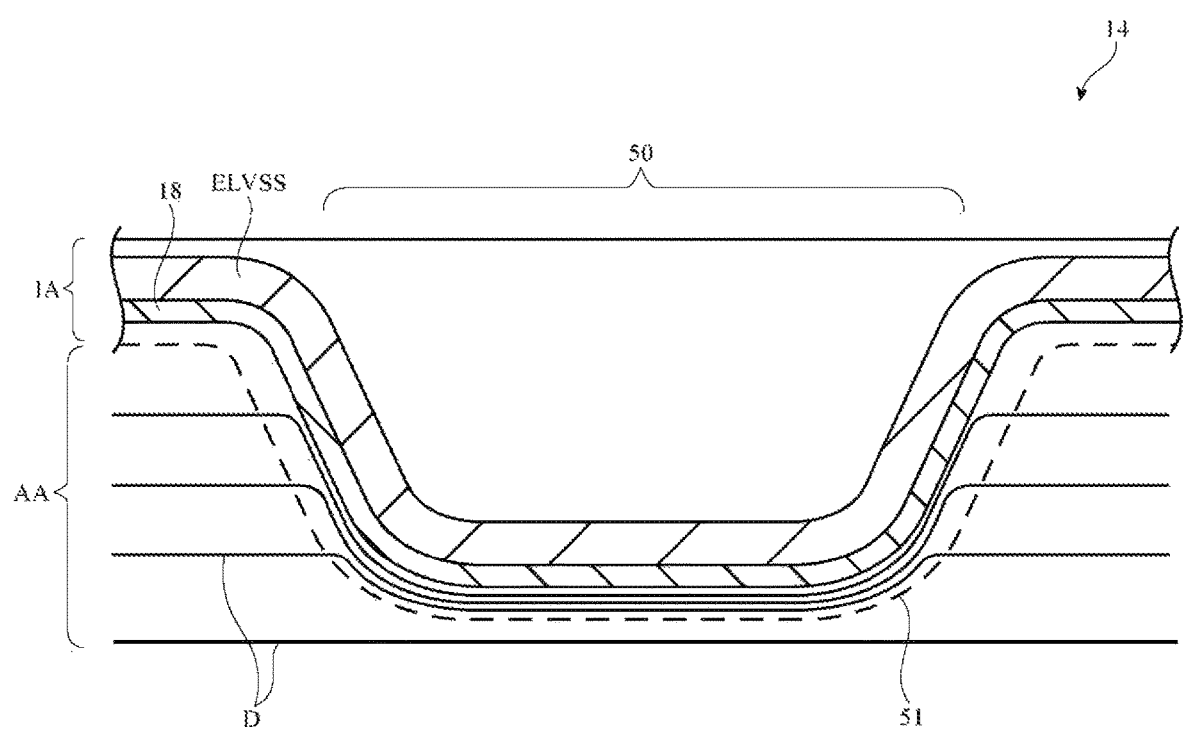
FIG. 9 is a diagram of a portion of a display having an inactive notch and data lines that are routed around the inactive notch in accordance with an embodiment.

An illustrative example of a display 14 having an inactive notch 50 is shown in FIG. 9. As shown in FIG. 9, the border 51 between the active area and the inactive area bends (extends) into the active area in notched region 50. Because notch 50 is be free of organic light-emitting diodes and other display structures that could obstruct components that are accommodated in the notch, conductive paths in display 14 that would normally extend in the inactive border (e.g., gate driver circuitry 18, ground power supply line ELVSS, etc.) or across the active area of the display (e.g., data lines D) may be routed around notched region 50. In FIG. 9, gate driver circuitry 18 and the ELVSS ground power supply line follow the indented border 51 of inactive area IA and avoid overlapping notch 50. These portions of the ELVSS ground power supply line and gate driver circuitry 18 may be referred to herein as curved portions, bent portions, serpentine portions, meandering portions, or deflected portions.

Although there are no pixels in notched region 50, there are portions of active area AA that do include pixels on either side of the notch. Because the pixels on either side of the notch still need to receive data signals on data lines D, the data lines may also be routed around notched region 50. In the example of FIG. 9, a data line D extends through active area AA on the left side of the notch 50. In this region, data line D is coupled to a corresponding row of pixels 22 to which it provides data signals. When the data line reaches notch 50, it follows the bent border of the notch-shaped portion of inactive area IA. Data lines D may have curved portions (sometimes referred to herein as bent portions, serpentine portions, meandering portions, or deflected portions) to accommodate notch 50. Because there are no pixels in notch 50, data line D is not coupled to any pixels in this region. The data line continues to follow the inactive border to the right side of the notch, where it extends back up to its corresponding row of pixels that is interrupted by the presence of notch 50. Once back in the active area, the data line is once again coupled to pixels in its corresponding row.

Because multiple rows of pixels are interrupted by the presence of notch 50, multiple data lines may need to be routed around the notch. The collective width of these data lines may create a notch border that, while free of pixels, is not suitable for accommodating components due to the presence of the data lines D. The farther into the active area the notch 50 extends (i.e., the more pixel rows are interrupted by notch 50), the greater the number of data lines that will have to be routed around the notch. An excessively large notch border may be visually unappealing.

Figure 10:
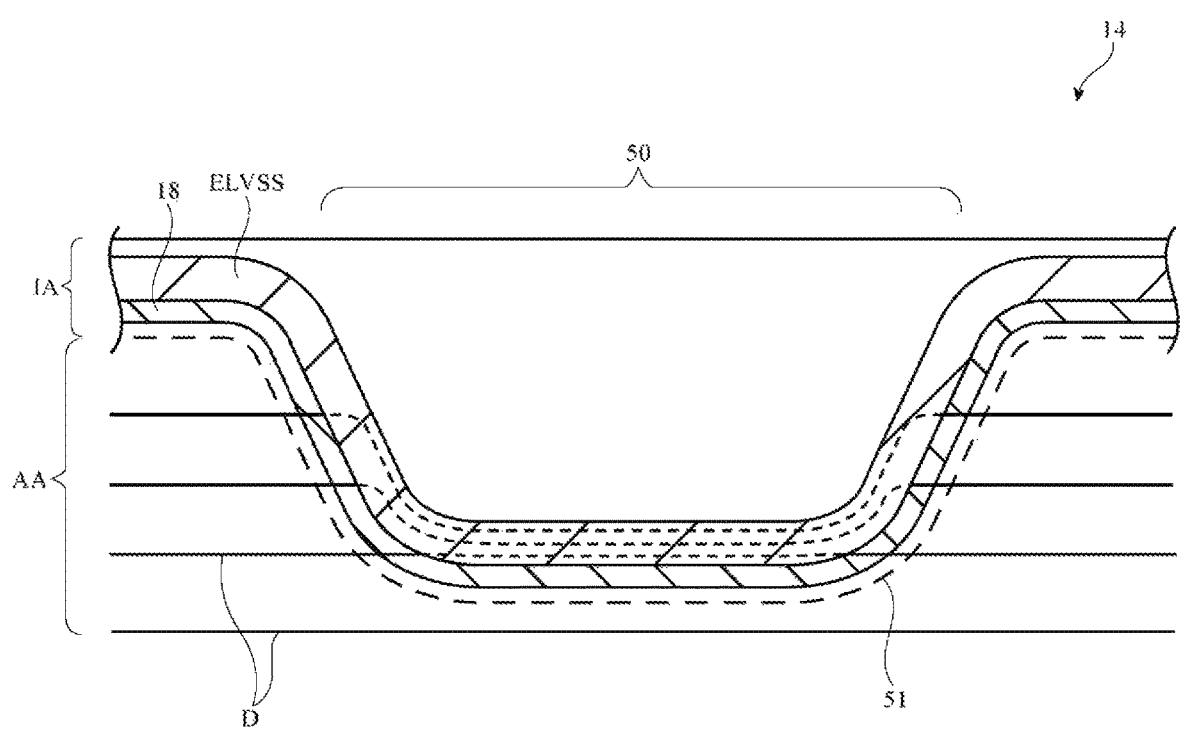
FIG. 10 is a diagram of a portion of a display having an inactive notch and data lines that are routed under a power supply path and around the inactive notch in accordance with an embodiment.

In order to minimize the width of the notch border, it may be helpful to route the data lines D underneath the ELVSS ground power supply line (e.g., as opposed to next to ELVSS ground power supply line as shown in FIG. 9). An illustrative example of a display 14 in which data lines D are routed under the ELVSS ground power supply line in the region around notch 50 is shown in FIG. 10. In FIG. 10, data lines D have curved portions that follow the inactive border upon reaching notch 50, but are formed using a metal layer that is underneath and overlapped by the metal layer used for the ELVSS ground power supply line. By routing the data lines underneath the ELVSS ground power supply line, the amount of room needed for routing display structures around notch 50 can be reduced and the width of the notch border can be minimized.

In order to ensure that data lines D can be routed underneath power supply line ELVSS, it may be helpful to modify the metal layers that are used for some of the structures in display 14. In the example of FIG. 9, the ELVSS power supply line may be formed from two layers of metal. In one suitable arrangement, the ELVSS power supply line may be formed from the same metal layers that are used to form the source-drain terminals of thin-film transistors in the active area of display 14. In an arrangement in which there are two source-drain metal layers (sometimes referred to herein as SD1 and SD2 metal layers), the ELVSS power supply line may be a multi-layer structure formed from both of the source-drain metal layers. These metal layers may be formed from a relatively low resistance metal. The output lines from gate driver circuitry 18 may also be formed from one of the source-drain metal layers (e.g., SD1). The data lines D may be formed from the same metal layers that are used to form gate lines for the thin-film transistors in the active area of display 14. In some arrangements, display 14 may include multiple gate line metal layers (sometimes referred to herein as GAT1 and GAT2 metal layers). These metal layers may be formed of a metal with higher resistance than that of the source-drain metal layers. In one suitable arrangement, data lines D may be formed from molybdenum.

In the example of FIG. 10, the arrangement of the metal layers near notch 50 may be modified to allow data lines D to be routed underneath power supply line ELVSS. For example, the ELVSS power supply line may transition from a two-layer structure formed from two layers of metal in the rest of display 14 to a single metal layer structure in the region in which data lines D are routed beneath the ELVSS power supply line. By using only one metal layer (e.g., only SD1) to form the ELVSS power supply line in this area, the additional metal layer of the data lines D may be routed underneath the ELVSS power supply line without increasing the overall number of metal layers that the ELVSS power supply line will overlap. If desired, the portions of data lines D that are routed underneath the ELVSS power supply line may also be formed from a different metal layer than in the rest of the display. For example, data lines D that are routed underneath the ELVSS power supply line may be formed from a higher resistivity metal layer that is below the metal layer used to form the data lines in the rest of the display. Vias that extend through planarization or other dielectric layers may be used to couple the data lines in the active area to the higher resistivity metal layer that is used to form the data lines in the vicinity of notch 50. An arrangement in which the metal layers used for the ELVSS power supply line and the data lines is changed only in the vicinity of notch 50 is merely illustrative. If desired, the modified arrangements for the ELVSS power supply line and the data lines described above may be incorporated throughout the display.

Routing data lines D around a notch 50 as shown in FIGS. 9 and 10 may cause charge coupling and data line loading issues that are similar to those described above in connection with FIG. 8. Because portions of data lines D that are routed around notch 50 are not coupled to pixels 22, these data lines may respond differently to applied voltages than data lines D that are not routed around notch 50. Routing a group of data lines D close together to avoid notch 50 may increase charge sharing and parasitic capacitive coupling between the data lines. In order to reduce these effects, data line loading circuitry 48 of the type described in connection with FIG. 8 may be coupled to data lines D that are routed around notch 50.

Figure 11:
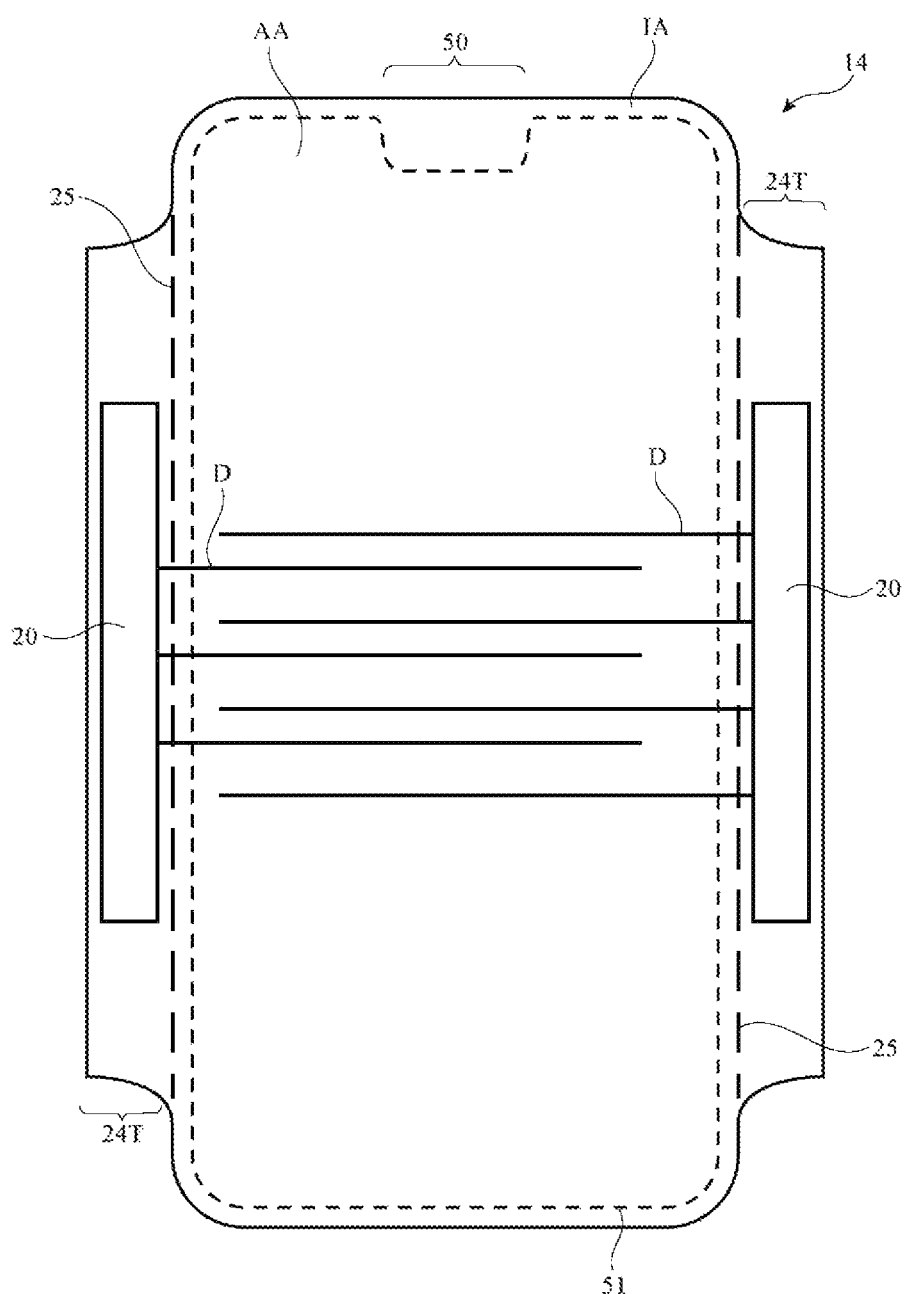
FIG. 11 is diagram of an illustrative display having two display driver circuits in accordance with an embodiment.

In the examples described above, increasing the row time by decreasing the effective number of gate lines by placing the display driver 20 along a long edge of the display allows for the incorporation of demultiplexer circuitry 34 and reduced display borders. Because increasing the row time may provide additional benefits (e.g., allowing for display 14 to be operated at a higher frame rate), it may be desirable to increase the row time by decreasing the effective number of gate lines without incorporating demultiplexer circuitry 34. In the example of FIG. 11, display 14 is provided with two display driver integrated circuits 20. By positioning the display driver integrated circuits 20 along the long edges of the display and reducing the number of gate lines, the row time of the display 14 in FIG. 11 may be increased. Incorporating two display driver integrated circuits 20 alleviates the need for demultiplexer circuitry 34, as each data line is provided with data signals directly from one of the two display drivers 20. The data lines D that are coupled to the display driver integrated circuits 20 may be arranged in an interdigitated pattern. The two display driver integrated circuits 20 can be synchronized with each other to ensure proper operation of display 14. As shown in FIG. 11, a display 14 incorporating two display drivers 20 may include a notch region 50. One or both of the tail portions 24T on which display drivers 20 are mounted may be bent back behind the active area of display 14 along bend axes 25.

The foregoing is merely illustrative and modifications can be made to the described embodiments. The foregoing embodiments may be implemented individually or in any combination.

What is claimed is:

1. A display comprising:
a substrate having a main portion and a tail portion, the substrate having first and second opposing edges and third and fourth opposing edges that are shorter than the first and second edges, and the tail portion extending from the first edge of the substrate;
pixels arranged in rows and columns on the substrate, a number of the rows being greater than a number of the columns;
data lines that extend across the rows and between the first edge and the second edge of the substrate;
gate lines that extend across the columns and between the third edge and the fourth edge of the substrate;
a display driver integrated circuit that is mounted on the tail portion of the substrate along the first edge of the substrate and supplies data signals to the data lines;
demultiplexer circuitry mounted on the main portion along the first edge of the substrate and coupled between the display driver integrated circuit and the data lines; and
conductive lines in a fanout region at the first edge and on the main portion, the conductive lines coupling the display driver integrated circuit to the demultiplexer circuitry, wherein the fanout region spans a first width in an inactive area of the display between the first edge and the pixels, and wherein encapsulation and evaporated layers, extending from an active area of the display, span a second width in the inactive area between the first edge and the pixels, the second width being greater than the first width.

2. The display defined in claim 1, wherein the display driver integrated circuit provides time-division multiplexed data signals to the demultiplexer circuitry using the conductive lines.

3. The display defined in claim 2, wherein the time-division multiplexed data signals comprise first and second data signals for first and second data lines in the display.

4. The display defined in claim 3, wherein the demultiplexer circuitry time-division demultiplexes the time-division multiplexed data signals, provides the first data signal to the first data line in the display at a first time, and provides the second data signal to the second data line in the display at a second time.

5. The display defined in claim 1, wherein the pixels form the active area of the display that is configured to display images, wherein the active area is surrounded by the inactive area, wherein a border between the active area and the inactive area deflects into the active area along the third edge to form a notch-shaped portion of the inactive area, and wherein portions of the data lines run along the border between the active area and the inactive area and have deflected portions that follow the deflected border along the notch-shaped portion of the inactive area.

6. The display defined in claim 1, wherein the pixels comprise organic light-emitting diodes.

7. An electronic device having first and second opposing sides comprising:
a housing;
a display at the first side having an active area and an inactive area and coupled to the housing, wherein the display has first and second opposing edges and third and fourth opposing edges that are longer than the first and second edges, the display comprising:
pixels that form the active area of the display that is configured to display images, wherein the active area is surrounded by the inactive area, and wherein a border between the active area and the inactive area bends into the active area along the first edge to form a notch-shaped portion of the inactive area; and
data lines that extend parallel to the first and second edges and that provide data signals to the pixels, wherein portions of the data lines run along the border between the active area and the inactive area and have bent portions that follow the border along the notch-shaped portion of the inactive area; and
a power supply line for the display in the inactive area, wherein the power supply line has a bent portion that follows the border along the notch-shaped portion of the inactive area, and the bent portions of the data lines are routed between the bent portion of the power supply line and the second side.

8. The electronic device defined in claim 7, further comprising:
a component mounted in the notch-shaped portion of the inactive area, wherein the component is selected from the group consisting of: a proximity sensor, an ambient light sensor, a camera, and a speaker.

9. The electronic device defined in claim 7, wherein a portion of the active area is interposed between the third edge and the notch-shaped portion of the inactive area, and wherein the data lines that have the bent portions provide data signals to pixels in the portion of the active area interposed between the third edge and the notch-shaped portion of the inactive area.

10. The electronic device defined in claim 7, further comprising:
a display driver integrated circuit; and
demultiplexer circuitry coupled between the display driver integrated circuit and the data lines, wherein the display driver integrated circuit provides time-division multiplexed data signals to the demultiplexer circuitry, wherein the time-division multiplexed data signals comprise first and second data signals for first and second data lines in the display, and wherein the demultiplexer circuitry time-division demultiplexes the time-division multiplexed data signals, provides the first data signal to the first data line in the display at a first time, and provides the second data signal to the second data line in the display at a second time.

11. The electronic device defined in claim 7, wherein the display is an organic light-emitting diode display.

12. An electronic device, comprising:
a housing; and
a display in the housing, the display comprising:
   rows and columns of pixels that form an active area of the display that is configured to display images, wherein the active area is surrounded by an inactive area of the display;
   gate lines that extend parallel to the columns of pixels and that provide gate signals to the pixels;
   data lines that extend parallel to the rows of pixels and that provide data signals to the pixels, wherein the display comprises more rows of pixels than columns of pixels;
   a display driver integrated circuit that provides the data signals and that is mounted on a tail portion extending from a side of the display parallel to the columns of pixels;
   a power supply signal line that extends from the tail portion to the active and inactive areas of the display and around an edge of the display, and that supplies a power supply signal to the pixels from the edge of the display;
   demultiplexing circuitry mounted along the side of the display and configured to perform demultiplexing operations for the data lines; and
   data line loading circuitry coupled to the data lines and configured to compensate for charge sharing between the data lines based on the demultiplexing operations, wherein the data line loading circuitry is disposed along the edge of the display.

13. The electronic device defined in claim 12, further comprising:
   an ambient light sensor that is mounted in the housing and that overlaps a notch-shaped inactive area portion of the display.

14. The electronic device defined in claim 12, wherein the tail portion is configured to be bendable behind the active area of the display.

15. The electronic device defined in claim 12, wherein a notch-shaped inactive area portion of the display is formed along the edge of the display.

\* \* \* \* \*